United States Patent [19]

Ternullo, Jr. et al.

[11] Patent Number: 6,061,296

[45] Date of Patent: May 9, 2000

[54] MULTIPLE DATA CLOCK ACTIVATION WITH PROGRAMMABLE DELAY FOR USE IN MULTIPLE CAS LATENCY MEMORY DEVICES

[75] Inventors: Luigi Ternullo, Jr., San Jose; Christopher Ematrudo, Campbell; Michael C. Stephens, Jr., San Jose, all of Calif.

[73] Assignee: Vanguard International Semiconductor Corporation, Hsinchu, Taiwan

[21] Appl. No.: 09/135,252

[22] Filed: Aug. 17, 1998

[51] Int. Cl.[7] ................................................ G11C 8/18
[52] U.S. Cl. .......................... 365/233; 365/202; 365/190; 365/194; 365/208
[58] Field of Search ................................. 365/233, 202, 365/194, 190, 208

[56] References Cited

U.S. PATENT DOCUMENTS

5,991,227  11/1999  Park ..................................... 365/230.08
6,005,825  12/1999  Lee et al. ................................. 365/233
6,009,040  12/1999  Choi et al. ............................... 365/233

*Primary Examiner*—Andrew Q. Tran
*Attorney, Agent, or Firm*—Christensen O'Connor Johnson & Kindness PLLC

[57] ABSTRACT

A timing scheme for multiple data clock activation with programmable delay for use in accessing a multiple CAS latency memory device. A multi-stage data propagation path is used to propagate a bit being accessed from a memory array of the device to an output line. Timing signals are generated so that in a CAS latency three mode, the timing signal that activates the next to last stage of the propagation path is triggered by an output clock signal that activates the last stage of the propagation path so that pulse from the output clock signal does not overlap with pulses of the timing signal that activates the previous stage. This timing scheme ensures the data lines feeding the last stage are not being restored while the last stage is sensing these data lines. A programmable delay circuit is used to adjust the timing of the output clock signal.

31 Claims, 6 Drawing Sheets

MULTIPLE DATA CLOCK ACTIVATION WITH PROGRAMMABLE DELAY FOR USE IN MULTIPLE CAS LATENCY MEMORY DEVICES

FIELD OF THE INVENTION

The present invention relates to clocking systems for memory devices and, more particularly, to clocking systems for accessing data in a memory device having a multiple CAS latency design.

BACKGROUND INFORMATION

Figure 1:
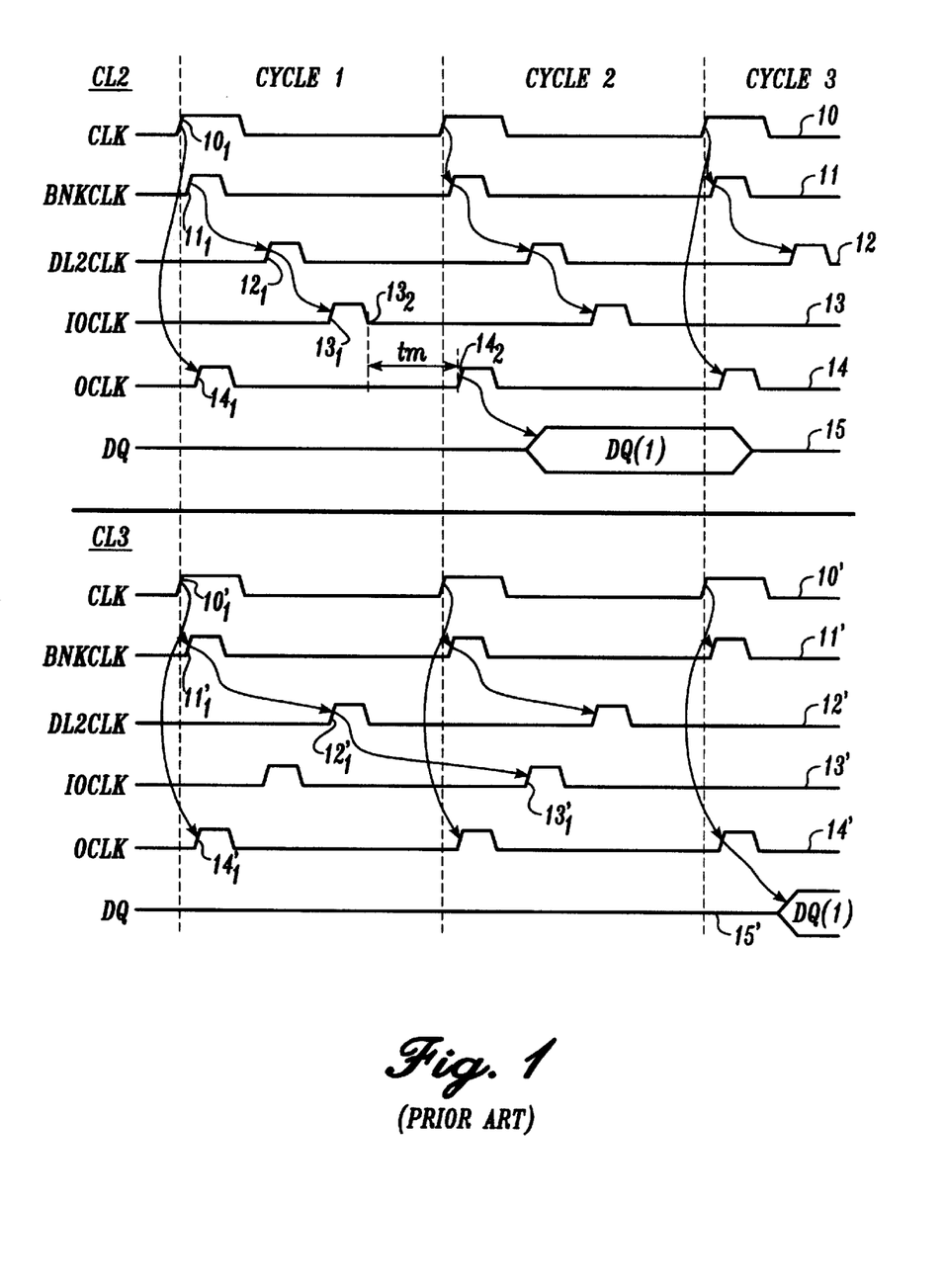
FIG. 1 is a timing diagram illustrative of a conventional data clocking system for a memory device having a multiple CAS latency design.

One type of synchronous memory device architecture includes several memory arrays that are activated in banks during a memory access. In this type of synchronous memory device, a bank clock is typically used to activate the clocking mechanism of a column path in a bank that is being accessed. FIG. 1 is a timing diagram illustrative of a conventional data clocking system for a memory device having a multiple column address strobe (CAS) latency design. More particularly, FIG. 1 shows the timing for a CAS latency two (CL2) and a CAS latency three (CL3) operational mode.

Waveforms 10–15 of FIG. 1, respectively, represent an external clock signal CLK, a bank clock signal BNKCLK, a data line clock signal DL2CLK, an input/output clock signal IOCLK, an output circuit clock signal OCLK and a data signal DQ during the CL2 mode. Similarly, waveforms 10'–15' represent clock signal CLK, signal BNKCLK, signal DL2CLK, signal IOCLK, signal OCLK and signal DQ during the CL3 mode. In both the CL2 and CL3 modes, the leading edges of signal CLK trigger leading edges in signals BNKCLK and OCLK. For example, leading edge $10_1$ (and $10_1'$) of signal CLK causes leading edges $11_1$ (and $11_1'$) in signal BNKCLK and leading edges $14_1$ (and $14_1'$) in signal OCLK. In addition, leading edges $11_1$ and $11_1'$ of signal BNKCLK, in turn, respectively trigger leading edges $12_1$ and $12_1'$ of signal DL2CLK.

Then, in a first cycle (i.e., cycle 1) of CL2 mode operation, leading edge $12_1$ of signal DL2CLK causes a leading edge $13_1$ in signal IOCLK. The timing of signal IOCLK is determined so as to achieve a time margin $t_m$ between a falling edge $13_2$ of signal IOCLK and a leading edge $14_2$ of signal OCLK in the next cycle (i.e., cycle 2). The timing of signal OCLK is carefully designed for proper operation. Signal OCLK is used to output data onto an output bus (not shown) that is captured from data lines (not shown) that were restored (or equilibrated) by signal IOCLK. Thus, the timing of signal OCLK is adjusted so that the signal on the data lines has time to be driven to the proper levels before signal OCLK causes the data lines to be sensed. Thus, delaying signal OCLK allows more time to sense the data lines during a current cycle, but at the cost of increasing $t_{AC}$ (access time) from the next rising edge of signal CLK. In practice, the timing of signal OCLK is adjusted during the design process so as to achieve an optimal trade off in view of the layout, loading, process variations of the semiconductor materials, etc.

However, adjusting the timing of signal OCLK to optimize the CL2 mode may adversely affect performance in the CL3 operational mode for the following reasons. As in the CL2 mode, a rising edge of signal DL2CLK triggers or fires signal IOCLK. However, in the CL3 mode, the firing of signal IOCLK is pushed into the next cycle (in the CL2 mode, signal DL2CLK fires signal IOCLK in the same cycle), as shown by leading edge $13_1'$ in FIG. 1. More specifically, in the CL3 mode, two cycles are used to drive the data onto the Data lines (not shown), which are then sampled and driven onto the output bus (not shown) in the third cycle in response to the firing of signal OCLK. Consequently, within the third cycle of a given read operation, signal OCLK must be fired before signal IOCLK is fired so that the Data lines (not shown) will be sampled and driven onto the output bus (not shown) before signal IOCLK restores the Data lines in preparation of receiving the IO-data of the next read operation. As a result, if the timing of signal OCLK is changed so that an OCLK pulse overlaps with an IOCLK pulse, the read operation may not generate the proper data. In view of the above discussion, there is a need for a data clocking system that can adjust the timing of signal OCLK to optimize each CAS latency mode while ensuring that within a given cycle, signal OCLK is fired before signal IOCLK is fired so that the OCLK and IOCLK pulses do not overlap.

SUMMARY

In accordance with the present invention, a timing scheme is provided for multiple data clock activation with programmable delay for use in accessing a multiple CAS latency memory device. In one aspect of the present invention, a multi-stage data propagation path is used to propagate a bit being accessed from a memory array of the device to an output line. Timing signals are generated so that in a CAS latency three mode, the timing signal that activates the next to last stage of the propagation path is triggered by the timing signal that activates the last stage of the propagation path (i.e., the output clock signal) so that these timing signals do not have any pulse overlap. This timing scheme ensures the data lines feeding the last stage are not being restored while the last stage is sensing these data lines. This aspect of linking the output clock signal to the timing signal of the next to last stage advantageously allows the timing of the output clock to be adjusted without affecting proper propagation of the data through the data propagation path.

In another aspect of the present invention, a programmable delay circuit is used to adjust the timing of the output clock signal. This aspect, in conjunction with the linking aspect described above, advantageously provides flexibility in adjusting the timing of the output clock signal to optimize other CAS latency modes at late stages in the process of designing the memory device. In one embodiment, the delay provided by the programmable delay circuit can be adjusted using fuses or standard metal option techniques to allow for low cost timing optimization after silicon (e.g., during wafer testing). Further, this scheme can be applied to other CAS latency modes (e.g., a CAS latency four mode) to increase flexibility in adjusting the timing of the output clock signal.

BRIEF DESCRIPTION OF THE DRAWINGS

The foregoing aspects and many of the attendant advantages of this invention will become more readily appreciated by reference to the following detailed description, when taken in conjunction with the accompanying drawings listed below.

DETAILED DESCRIPTION

Figure 2:
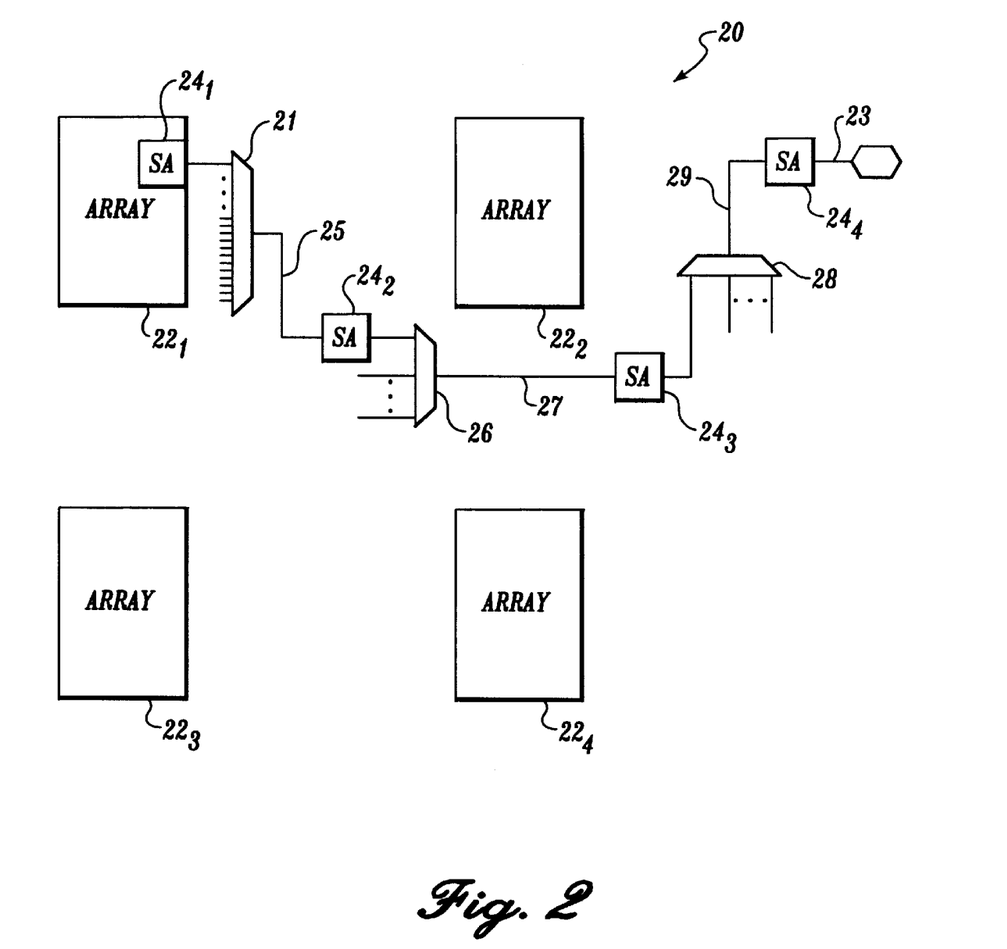
FIG. 2 is a block diagram illustrative of a data access architecture in a memory device.

FIG. 2 is a block diagram illustrative of a portion 20 of a data access architecture in a memory device. This embodiment is adapted for a synchronous dynamic random access memory (SDRAM) device. For clarity, the same reference numbers are used between drawings to indicate elements having the same or similar function or structure. Portion 20 includes memory cell arrays $22_1$–$22_4$, but, as will be appreciated by those skilled in the art of memory devices, the memory device may include many more arrays. An activation path includes four stages of sense amplifiers between an array and the output bus. For example, one activation path from array $22_1$ to a line 23 of the output bus includes sense amplifiers $24_1$–$24_4$. In this embodiment, sense amplifiers $24_1$–$24_4$ are essentially conventional latching sense amplifiers. This type of sense amplifier is well known in the art and, thus, is omitted for conciseness. Alternatively, sense amplifiers $24_2$–$24_4$ can be replaced with latching circuits or buffers. This activation path is just one of the many activation paths that correspond to different addresses of the memory device.

Sense amplifier $24_1$ is disposed in array $22_1$ to sense the addressed bit lines. Sense amplifier $24_1$ is connected to sense amplifier $24_2$ through a multiplexer 21 and an interconnect 25. In this embodiment, interconnect 25 includes two first stage data lines for propagating a differential data signal consisting of signals DL1 and $\overline{DL1}$. This differential signal is generated by sense amplifier $24_1$ and represents the sensed bit lines in array $22_1$.

Sense amplifier $24_2$ in turn feeds sense amplifier $24_3$ through a multiplexer 26 and interconnect 27. Interconnect 27 includes two second stage data lines for propagating a differential signal consisting of signals DL2 and $\overline{DL2}$. This differential signal is generated by sense amplifier $24_2$ and represents the sensed bit lines in array $22_1$. In an alternative embodiment in which the sense amplifiers can be configured into a high impedance state, multiplexer 26 may be omitted. Instead, the output lines of the second stage sense amplifiers of different arrays can be connected directly to interconnect 27, with the inactive sense amplifiers being in the high impedance state.

Sense amplifier $24_3$ in turn provides a differential signal representing the sensed bit lines of array $22_1$ to sense amplifier $24_4$ through a multiplexer 28 and interconnect 29. Interconnect 29 includes two Data lines for propagating a differential signal consisting of signals IO and $\overline{IO}$. As described above, multiplexer 26 may be omitted for devices in which inactive sense amplifiers are configured in the high impedance state. Sense amplifier $24_4$ is single-ended in this embodiment, with its output line connected to line 23 of the output bus. The timing and operation of portion 20 is described below in conjunction with FIGS. 3–5.

Figure 3:
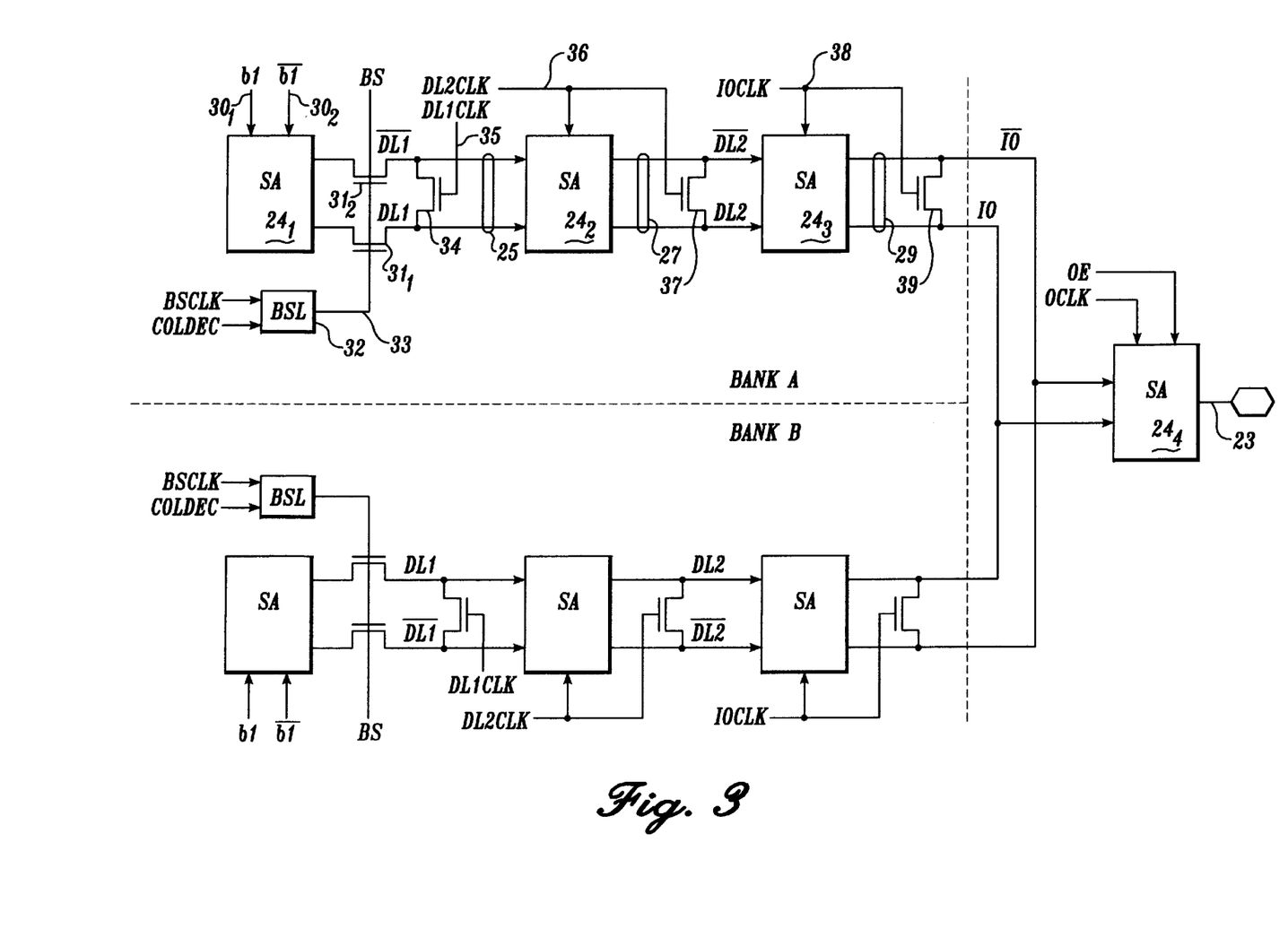
FIG. 3 is a more detailed diagram of the data access architecture of FIG. 2, illustrative of a data access architecture of two banks in a memory device.

FIG. 3 illustrates in more detail the activation path described above in conjunction with FIG. 2, according to one embodiment of the present invention. In this embodiment, the arrays are arranged in two banks, with a bank clock signal activating the column path of the appropriate array of the bank being accessed. In this example, the activation path from sense amplifier $24_1$ to line 23 of the output bus is in bank A. Bank B includes, in effect, a mirror image of bank A, which is activated when a different bank address is being accessed.

Sense amplifier $24_1$ is connected to sense bit lines b1 and $\overline{b1}$ through lines $30_1$ and $30_2$, respectively. The output lines of sense amplifier $24_1$ are connected to interconnect 25 through bit switches $31_1$ and $31_2$, which are used to multiplex data from sense amplifier $24_1$ to interconnect 25. As will be appreciated by those skilled in the art of memory devices, this multiplexing is required because an array generally contains a large number of columns (e.g., 128 in one embodiment). In this embodiment, the bit switches are implemented with N-channel transistors. A bit switch latch 32 is connected to receive a bit switch clock signal and a column decode signal and, in response to these signals, the bit switch latch provides a bit switch control signal BS to gates of bit switches $31_1$ and $31_2$ through line 33.

In this embodiment, an N-channel transistor 34 is used to implement an equilibration switch that is connected between first stage data lines of interconnect 25 (propagating signals DL1 and $\overline{DL1}$). N-channel transistor 34 is controlled to short-circuit the data lines in response to a signal DL1CLK in a "restore" operation. That is, the voltage levels on the data lines of interconnect 25 are restored to a midpoint value to improve average speed and reduce power dissipation relative to a non-precharge architecture. In particular, N-channel transistor 34 is connected to receive signal DL1CLK at its gate though line 35. Thus, a logic high voltage level of signal DL1CLK "restores" the data lines of interconnect 25 to an intermediate level when one data line is at the VDD level and the other data line is at the VSS level just prior to signal DL1CLK firing.

Sense amplifier $24_2$ is connected to receive a signal DL2CLK through a line 36. Signal DL2CLK controls the activation of sense amplifier $24_2$ in sensing signals on interconnect 25. In addition, line 36 is connected to the gate of a N-channel transistor 37 that serves as an equilibration switch for second stage data lines of interconnect 27 that propagate second level signals DL2 and $\overline{DL2}$. Thus, assertion of signal DL2CLK causes both sensing of signals DL1 and $\overline{DL1}$ on interconnect 25 and "restoring" of the data lines of interconnect 27 that propagate signals DL2 and $\overline{DL2}$.

Sense amplifier $24_3$ is connected to receive signal IOCLK through a line 38. Signal IOCLK controls the activation of sense amplifier $24_3$ in sensing signals on interconnect 27. In addition, line 38 is connected to the gate of an N-channel transistor 39 that serves as an equilibration switch for data lines of interconnect 29 that propagate signals IO and $\overline{IO}$. Thus, assertion of signal IOCLK causes both sensing of the data lines of interconnect 27 that propagate signals DL2 and $\overline{DL2}$ and "restoring" of the data lines of interconnect 29 that propagate signals IO and $\overline{IO}$.

Sense amplifier $24_4$ is connected to data lines IO and $\overline{IO}$ driven by sense amplifier $24_3$ and, in addition, the data lines of the mirror-image sense amplifier in BANK B. Sense amplifier $24_4$ also receives signal OCLK, which controls sense amplifier $24_4$ in sensing signals on the data lines.

In alternative embodiments, sense amplifiers $24_2$–$24_4$ can be replaced with latches or buffers, which can be either single-ended or double-ended.

Figure 4:
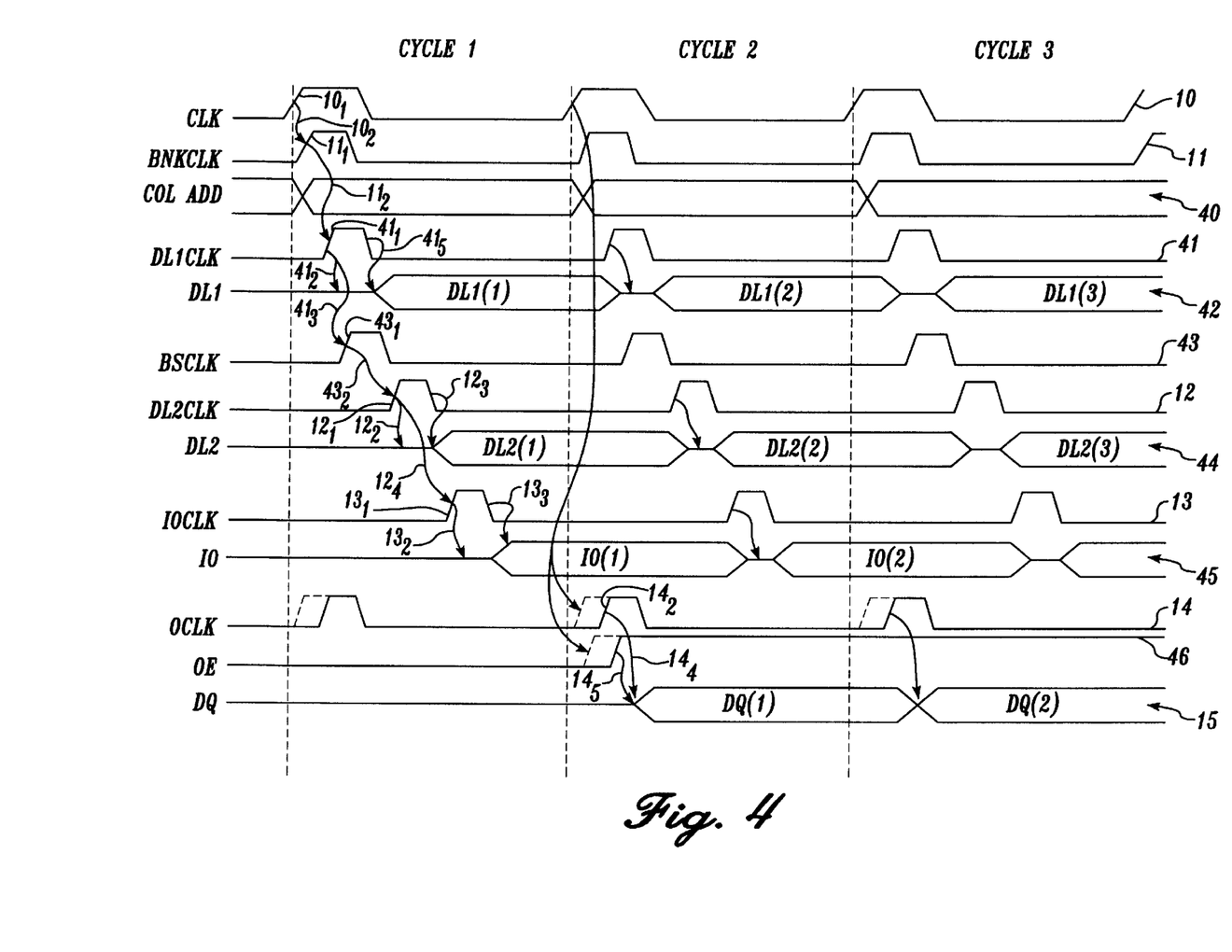
FIG. 4 is a timing diagram illustrative of the timing of a CAS latency two (CL2) operational mode, according to one embodiment of the present invention.

FIG. 4 is a timing diagram illustrative of the timing of a CL2 operational mode, according to one embodiment of the present invention. FIG. 4 is similar to the upper half of FIG.

1, except that FIG. 4 includes additional waveforms 40–46. Referring to FIGS. 3 and 4, waveforms 40–46 respectively represent a column address signal, signal DL1CLK, a first stage data signal DL1 present on interconnect 25, bit switch clock signal BSCLK, a second stage data signal DL2 present on interconnect 27, signal IO present on interconnect 29 and an output enable signal OE.

Still referring to FIGS. 3 and 4, signals flow through the example data activation path in a read operation as follows. An initial step is the bit line sensing by sense amplifier $24_1$. However, this step is conventional and, thus, is not described for conciseness. As in the timing diagram of FIG. 4, leading edges of external clock signal CLK trigger leading edges in bank clock signal BNKCLK when the bank (i.e., bank A in this example) is being accessed. When the bank is not being accessed, signal BNKCLK remains at a logic low level. Thus, leading edge $10_1$ of external clock signal CLK triggers leading edge $11_1$ of signal BNKCLK, as indicated by arrow $10_2$.

In turn, leading edge $11_1$ of signal BNKCLK triggers a leading edge $41_1$ in signal DL1CLK, as indicated by arrow $11_2$. The now logic high level of signal DL1CLK turns on N-channel transistor 34, thereby restoring the first stage data lines of interconnect 25 as indicated by arrow $41_2$. In addition, the logic high level of signal DL1CLK also triggers a leading edge $43_1$ in bit switch clock signal BSCLK.

Leading edge $43_1$ of signal BSCLK in turn triggers bit switch latch 32, which has been selected or decoded in response to the column address present in waveform 40 during cycle 1. That is, a different set of bit switches are selected according to the address to select the sense amplifier for the addressed column. For example, in one embodiment, a 1-to-128 decode operation is performed through appropriate activation of the bit switches. For the particular address corresponding to sense amplifier $24_1$, the address decode operation causes column decode signal COLDEC to be asserted. Bit switch latch 32 then asserts bit switch control signal BS to turn on bit switches $31_1$ and $31_2$ to enable sense amplifier $24_1$ to drive the differential first stage data signal on interconnect 25. Signal DL1CLK is timed so that it transitions to a logic low level essentially simultaneously with the assertion of bit switch control signal BS. When signal DL1CLK transitions to a logic low level (thereby ending the restore operation of interconnect 25), sense amplifier $24_1$ begins to develop a data signal DL1(1) (i.e., the first stage data signal for the read operation initiated in cycle 1), as indicated by arrow $41_5$.

Leading edge $43_1$ of signal BSCLK also triggers leading edge $12_1$ of signal DL2CLK, as indicated by arrow $43_2$. As described above, assertion of signal DL2CLK causes sense amplifier $24_2$ to sense the first stage data differential signal (DL1 and $\overline{DL1}$) on interconnect 25 and essentially concurrently restore the second stage data lines of interconnect 27. Signal DL2CLK restores the second stage data lines by turning on N-channel transistor 37, which then short circuits the second stage data lines of interconnect 27, thereby causing data signal DL2 to reach an intermediate level as indicated by arrow $12_2$. When signal DL2CLK transitions to a logic low level, sense amplifier $24_2$ begins to develop a data signal DL2(1) (i.e., the second stage data signal of the read operation initiated in cycle 1), as indicated by arrow $12_3$.

Leading edge $12_1$ of signal DL2CLK also triggers leading edge $13_1$ of signal IOCLK, as indicated by arrow $12_4$. As described above, a logic high level of signal IOCLK causes sense amplifier $24_3$ to sense the second stage data signal on interconnect 27 and, essentially concurrently, turn on N-channel transistor 39 to restore the data lines of interconnect 29. When turned on, N-channel transistor 39 short circuits the data lines of interconnect 29, causing data signal IO to reach an intermediate level, as indicated by arrow $13_2$. When signal IOCLK transitions to a logic low level, sense amplifier $24_3$ begins to develop a data signal IO(1) (i.e., the data signal of the read operation initiated in cycle 1), as indicated by arrow $13_3$. As shown in FIG. 4, leading edge $13_1$ is timed to occur after the falling edge $12_3$ of the signal DL2CLK so that sense amplifier $24_3$ is not activated until after the restore operation of interconnect 27 is complete.

Then when a leading edge $14_2$ of signal OCLK is triggered in the next cycle (i.e., cycle 2), sense amplifier $24_4$ is activated to sense the data lines of interconnect 29. In response to the sensed data signal on interconnect 29, sense amplifier $24_4$ generates an output data signal DQ(1) (i.e., the output data signal corresponding to the read operation initiated in cycle 1) onto line 23 of the output bus when output enable signal OE (waveform 46) is asserted, as indicated by arrows $14_4$ and $14_5$. In a burst read operation, the process would then be repeated in cycle 2 for a next address with the next output data signal (i.e., DQ(2)) being outputted on the output bus in cycle 3, and so on until the end of the burst. The burst length is typically programmable to one, two, four, eight or a full page.

As shown in FIG. 4, the dashed lines of waveforms 14 and 46 indicate that the leading edges of signals OCLK and OE can be adjusted to optimize performance. As described above, the timing of signal OCLK is typically adjusted with respect to signal IOCLK so as to optimize the time for the bit line data to propagate to sense amplifier $24_4$ relative to the access time $t_{AC}$ (i.e., the time from a leading edge of the external clock signal to the first valid edge of the data signal DQ in the same cycle). This relative timing between signal OCLK and IOCLK crosses the cycle time boundary (i.e., the timing of when signal IOCLK occurs in cycle 1 relative to the timing of when signal OCLK occurs in cycle 2).

However, when the timing of signal OCLK is adjusted, the timing of signal OE must also be adjusted. More specifically, the timing between the leading edges of signals OCLK and OE is designed so that a leading edge of signal OE arrives to trigger sense amplifier $24_4$ to propagate the sensed output data to the output bus with minimal delay and to eliminate unnecessary switching of signal DQ. In particular, it is desirable that signal OE arrive as soon as possible after sense amplifier $24_4$ has latched signals IO and $\overline{OI}$ to reduce the access time $t_{AC}$. Signals OCLK and OE are linked so that this relative timing remains fixed even when the timing of signal OCLK is adjusted. One implementation used to achieve this timing between signals OCLK, IOCLK and OE is described below in conjunction with FIG. 6.

The CL2 mode is advantageously used when the cycle time (i.e., the period of external clock signal CLK) is relatively large so that the data signal representing the addressed bit in the array can propagate through three stages of sensing and still have enough time to be properly accessed on the output bus in the second cycle. However, for shorter cycle times (and using memory chips of the same speed grade), the CL3 mode may be used, as described below in conjunction with FIG. 5.

Figure 5:
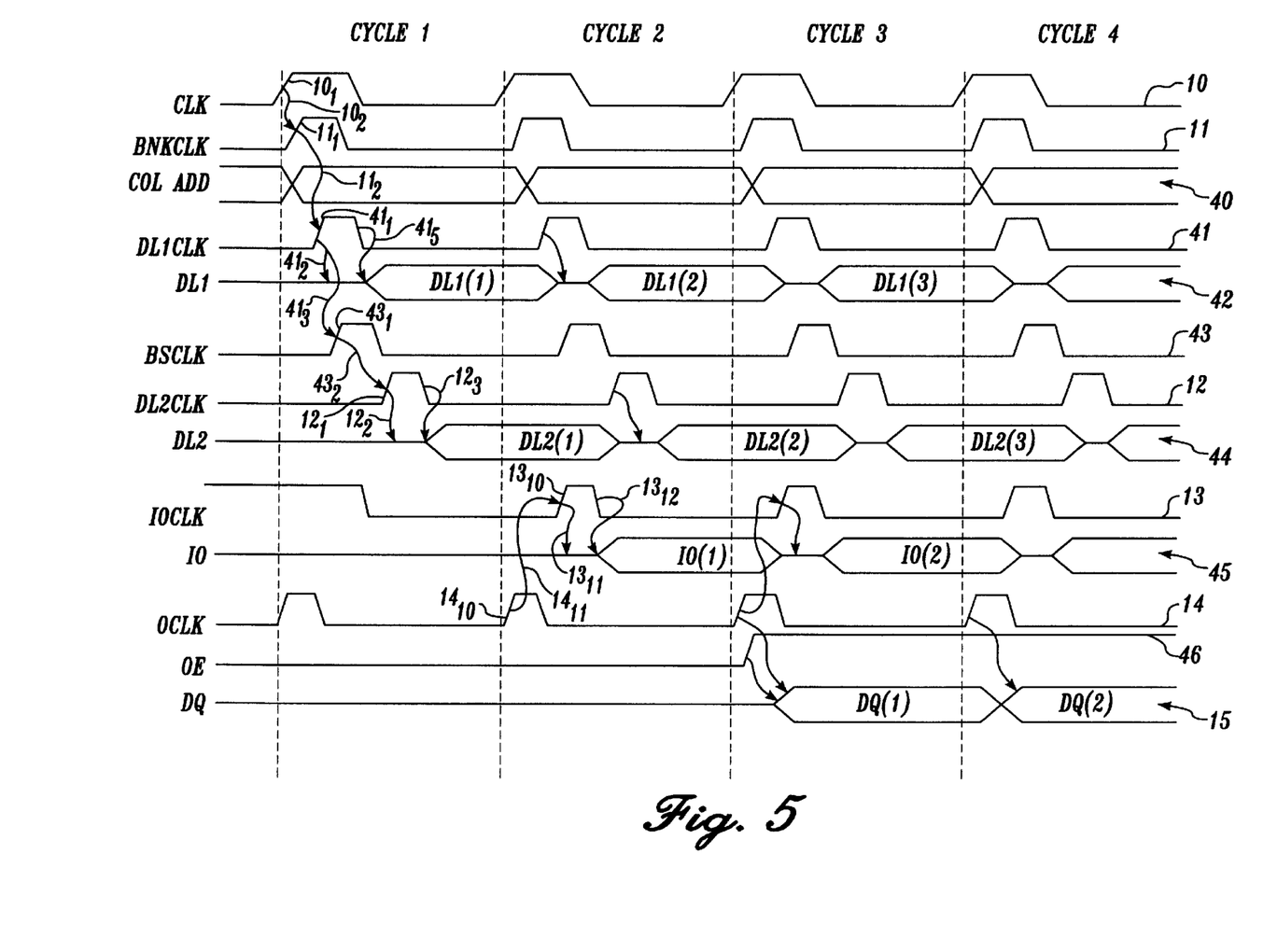
FIG. 5 is a timing diagram illustrative of the timing of a CAS latency three (CL3) operational mode, according to one embodiment of the present invention.

FIG. 5 is a timing diagram illustrative of the timing of a CL3 operational mode, according to one embodiment of the present invention. The triggering of the signals in embodiment of the CL3 mode is substantially similar to the triggering of signals in the CL2 mode (FIG. 4), except that signal IOCLK is triggered by signal OCLK instead of signal DL2CLK as in the CL2 mode. The timing of the CL3 mode is the same as in the CL2 mode (FIG. 4) for signals CLK, BNKCLK, COLADD, DL1CLK, DL1, BSCLK, DL2CLK and DL2.

Referring to FIGS. 3 and 5, in the CL3 mode, the generation of signal IOCLK is delayed until the second cycle (cycle 2) so that the output data signal DQ(1) is propagated to output bus line 23 during the third cycle (cycle 3). However, to ensure that signal OCLK does not cause sense amplifier $24_4$ to capture data on the data lines of interconnect 29 as signal IOCLK is restoring these data lines, signal IOCLK is triggered using signal OCLK. During the CL3 mode, a leading edge $14_{10}$ of signal OCLK causes a leading edge $13_{10}$ in signal IOCLK after a predetermined delay, as indicated by arrow $14_{11}$. This predetermined delay is designed to be longer than the pulse width of signal OCLK, thereby preventing overlap of an OCLK pulse with an IOCLK pulse. Alternatively, the generation of signal IOCLK pulses may be triggered by falling edges of signal OCLK. The now logic high level of signal IOCLK then restores the data lines of interconnect 29, as indicated by arrow $13_{11}$. This linking of signal IOCLK to signal OCLK ensures a margin between the leading edges of these signals with a single cycle time so that signal IOCLK cannot cause the data lines of interconnect 29 to be restored while signal OCLK is causing sense amplifier $24_4$ to capture a data signal on these data lines. Moreover, this scheme advantageously allows the timing of signal OCLK to be adjusted to optimize both the CL2 and CL3 modes without causing overlap of IOCLK and OCLK pulses.

Figure 6:
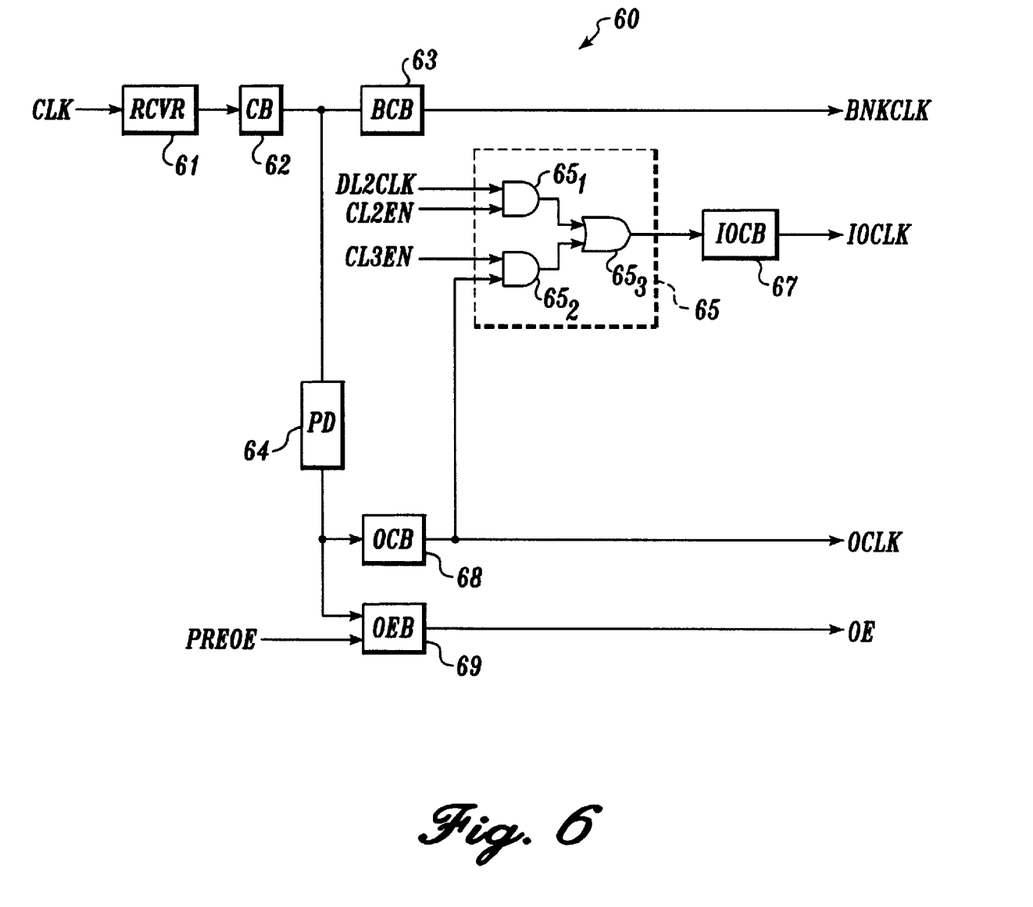
FIG. 6 is a block diagram illustrative of a data clock generation circuit, according to one embodiment of the present invention.

FIG. 6 is a block diagram illustrative of a data clock generation circuit 60, according to one embodiment of the present invention. Data clock generation circuit 60 includes a receiver 61, a clock buffer 62, a bank clock buffer 63, a programmable delay 64, logic circuit 65, IO clock buffer 67, output clock buffer 68 and output enable buffer 69. In this embodiment, logic circuit 65 includes AND gates $65_1$ and $65_2$ and OR gate $65_3$.

Data clock generation circuit 60 is interconnected as follows. Receiver 61 has an input lead connected to receive external clock signal CLK and an output lead connected to an input lead of clock buffer 62. Clock buffer 62 has an output lead connected to input leads of bank clock buffer 63 and programmable delay 64. Programmable delay 64 has an output lead connected to input leads of output enable buffer 69 and output clock buffer 68. Output clock buffer 68 has an output lead connected to one input lead of two-input AND gate $65_2$. The other input lead of AND gate $65_2$ is connected to receive a CL3 enable signal CL3EN that is asserted when the memory device is configured in the CL3 mode. The output lead of AND gate $65_2$ is connected to one input lead of two-input OR gate $65_3$. The output lead of OR gate $65_3$ is connected to IO clock buffer 67, whereas the other input lead of OR gate $65_3$ is connected to the output lead of two-input AND gate $65_1$. One input lead of AND gate $65_1$ is connected to receive signal DL2CLK. The other input lead of AND gate $65_1$ is connected to receive a signal CL2EN that is asserted when the memory device is configured in the CL2 mode. Signals CL2EN and CL3EN are generated by a configuration control circuit (not shown).

Data clock generation circuit 60 operates as follows. Receiver 61 receives external LVTTL clock signal CLK and propagates the received signal to clock buffer 62 as clock signal CLK with CMOS levels. Clock buffer 62 then propagates clock signal CLK to bank clock buffer 63, which is configured to generate bank clock signal BNKCLK so that the pulses of signal BNKCLK have a desired pulse width. Although not shown in FIG. 6, signal BNKCLK is used to generate signals DL1CLK and DL2CLK (FIGS. 4 and 5). In light of this disclosure, those skilled in the art of memory devices appreciate that signals DL1CLK and DL2CLK are slightly delayed versions of signal BNKCLK and can be generated in any suitable manner. For example, an even number of cascaded inverters coupled to receive signal BNKCLK may be used to generate signals DL1CLK and DL2CLK.

The output signal of clock buffer 62 is also received by programmable delay 64. Programmable delay is implemented with an even number of cascaded inverters. The number of cascaded inverters can be programmed to adjust the timing of signal OCLK to optimize performance as described above. For example, spare inverters can be connected into (or un-needed inverters removed from) the cascade using fuses or metal option techniques. Programmable delay 64 then propagates the delayed version of clock signal CLK to output clock buffer 68 and output enable buffer 69. Output clock buffer 68 then generates signal OCLK from the output signal of programmable delay 64. Output enable buffer 69 then generates output enable signal OE in response to the delayed signal CLK and a pre-output enable signal PREOE. Signal PREOE is only asserted during read operations, and when not asserted, it causes the output circuit of sense amplifier $24_4$ to be in a high impedance state. In addition, for both the CL2 and CL3 modes, signal PREOE is asserted in the cycle preceding the "output" cycle to "activate" output enable buffer 69. This timing of the PREOE signal configures output enable buffer 69 to assert output enable signal OE in the next cycle with the desired timing with respect to signal OCLK so that the output data can be propagated onto the output bus. Signal PREOE is generated by a control circuit (not shown) as a function of the operational mode (e.g., a CL3 mode read operation).

Signal IOCLK is generated as follows. In the CL2 mode, signals CL2EN and CL3EN have a logic high level and a logic low level, respectively. Consequently, AND gate $65_1$ propagates signal DL2CLK to OR gate $65_3$, while AND gate $65_2$ propagates a logic low level to OR gate $65_3$. Thus, signal DL2CLK is propagated by OR gate $65_3$ to IO clock buffer 67, thereby triggering IO clock buffer 67 to generate signal IOCLK. A delay circuit (not shown) may be inserted in IO clock buffer 67 when the propagation delay through the logic gates of logic circuit 65 is not long enough to cause the rising edges of signal IOCLK to occur after falling edges of signal DL2CLK. Alternatively, this delay circuit may be inserted in the input lead of AND gate $65_1$ that is connected to receive signal DL2CLK. In this way, the timing of signal IOCLK as illustrated in FIG. 4 is achieved.

In contrast, in the CL3 mode, signals CL2EN and CL3EN have a logic low level and a logic high level, respectively. Consequently, AND gate $65_1$ propagates a logic low level signal to OR gate $65_3$, while AND gate $65_2$ propagates signal OCLK to OR gate $65_3$. Thus, signal OCLK is propagated by OR gate $65_3$ to IO clock buffer 67, thereby triggering IO clock buffer 67 to generate signal IOCLK. As for the CL2 mode logic path, a delay circuit (not shown) may be inserted in IO clock signal buffer 67 or in the input lead of AND gate $65_2$ connected to receive signal OCLK when the propagation delay through logic circuit 65 and IO clock buffer 67 is not long enough to cause the rising edges of signal IOCLK to occur after falling edges of signal OCLK. In this way, the timing of signal IOCLK as illustrated in FIG. 5 is achieved.

Alternatively, IO clock buffer 67 can be implemented as disclosed in co-pending and commonly assigned U.S. Pat.

application Ser. No. 09/071,601 filed May 1, 1998, entitled "Timing Circuit That Selectively Triggers On A Rising Or Falling Input Signal Edge" and incorporated herein by reference. In this way, signal IOCLK can be triggered off of the falling edges of signal DL2CLK (in the CL2 mode) and signal OCLK (in the CL3 mode). This would eliminate the need the for delay circuits in logic circuit 65 or IO clock buffer 67, while ensuring that the rising edges of signal IOCLK occur after the falling edges of signal DL2CLK (in the CL2 mode) and signal OCLK (in the CL3 mode).

This scheme can be expanded to operate in a CAS latency 4 operational mode by pushing the triggering of signal IOCLK into the third cycle. In light of this disclosure, those skilled in the art of memory devices can, without undue experimentation, modify logic circuit 65 to trigger signal IOCLK in the third cycle. To operate in a CAS latency 1 operational mode, logic circuit 65 can be modified to disable or bypass output clock buffer 68 and generate signals OCLK and OE as edge-triggered pulses from signal IOCLK.

The embodiments of the multiple clock activation scheme described above are illustrative of the principles of the present invention and are not intended to limit the invention to the particular embodiments described. For example, although a SDRAM application is described, this scheme can be implemented in synchronous graphics RAM, double data rate DRAM, synchronous link DRAM, RAMBUS®, and synchronous SRAM devices, etc. In an alternative embodiment, in light of the present disclosure, those skilled in the art can devise other implementations of the delay circuits instead of the cascaded inverters described. For example, delay can be achieved and/or adjusted by adding a capacitive load within the delay circuit or by altering the trip-points of inverting logic gates used to implement the delay circuit. In addition, those skilled in the art, in light of this disclosure, can implement data clock generation circuit 60 (FIG. 6) using different logic gates or circuit structures that achieve the same function and delay. Accordingly, while the preferred embodiment of the invention has been illustrated and described, it will be appreciated that various changes can be made therein without departing from the spirit and scope of the invention.

We claim:

1. A method for accessing data in a memory array, the method comprising:

sensing a bit in the memory array;

generating a first clock signal, the first clock signal having a first pulse;

generating a second clock signal, the second clock signal having a second pulse;

generating a third clock signal, the third clock signal having a third pulse and a fourth pulse, the fourth pulse occurring before the third pulse; and propagating a signal representing a logic level of the bit to an output line through a plurality of stages, the plurality of stages including a first stage and a second stage, the first stage being coupled to a first interconnect and a second interconnect, the second stage being coupled to the second interconnect and the output line, wherein:

the first interconnect is configured to receive a first data signal that is dependent on the logic level of the bit;

the second pulse causes the first stage to generate on the second interconnect a second data signal as a function of the first data signal; and the third pulse causes the second stage to generate onto the output line an output signal that is dependent on the second data signal, and wherein, during a first mode, the second pulse is triggered by the first pulse and, during a second mode, the second pulse is triggered by the fourth pulse.

2. The method of claim 1 wherein during the first mode, the second pulse occurs in a first cycle and the third pulse occurs in a next cycle.

3. The method of claim 1 wherein during the second mode, the second and fourth pulses begin in a first cycle and the third pulse begins in a next cycle.

4. The method of claim 1 wherein the first pulse causes a restore operation of the first interconnect.

5. The method of claim 4 wherein the second pulse causes a restore operation of the second interconnect.

6. The method of claim 1 wherein the plurality of stages consists of four stages.

7. The method of claim 1 wherein the third clock signal is generated in response to a delayed version of an external clock signal, the delayed external clock signal also triggering an output enable signal.

8. The method of claim 7 wherein the timing of the third clock signal is programmable while maintaining an essentially constant relative timing between the output enable signal and the third clock signal.

9. The method of claim 1 wherein the timing of the third clock signal is programmable while maintaining an essentially constant relative timing between the second clock signal and the third clock signal during the second mode.

10. The method of claim 9 further comprising selectively causing pulses of the first clock signal or the third clock signal to trigger pulses in the second clock signal.

11. A circuit for accessing data in a memory array, the circuit comprising:

means for sensing a bit in the memory array;

a plurality of stages including a first stage and a second stage;

a first interconnect coupled to the first stage configured to receive a first data signal that is dependent on the logic level of the bit;

a second interconnect configured to couple the first stage to the second stage;

an output line coupled to the second stage;

means for generating a first clock signal, the first clock signal having a first pulse;

means for generating a second clock signal, the second clock signal having a second pulse, wherein the second pulse causes the first stage to generate on the second interconnect a second data signal as a function of the first data signal; and means for generating a third clock signal, the third clock signal having a third pulse and a fourth pulse, the fourth pulse occurring before the third pulse, wherein the third pulse causes the second stage to generate onto the output line an output signal that is dependent on the second data signal;

wherein, during a first mode, the second pulse is triggered by the first pulse and, during a second mode, the second pulse is triggered by the fourth pulse.

12. The circuit of claim 11 wherein during the first mode, the second pulse begins in a first cycle and the third pulse begins in a next cycle.

13. The circuit of claim 11 wherein during the second mode, the second and fourth pulses begin in a first cycle and the third pulse begins in a next cycle.

14. The circuit of claim 11 wherein the first pulse causes a restore operation of the first interconnect.

15. The circuit of claim 14 wherein the second pulse causes a restore operation of the second interconnect.

16. The circuit of claim 11 wherein the plurality of stages consists of four stages.

17. The circuit of claim 11 further comprising means for generating an output enable signal, wherein a pulse of the output enable signal is triggered by a pulse of a delayed version of an external clock signal.

18. The circuit of claim 17 further comprising a programmable delay for selectively adjusting the timing of the third clock signal while maintaining an essentially constant relative timing between the output enable signal and the third clock signal.

19. The circuit of claim 11 further comprising means for selectively adjusting the timing of the third clock signal while maintaining an essentially constant relative timing between the second clock signal and the third clock signal during the second mode.

20. The circuit of claim 19 further comprising means for selectively causing pulses of the first clock signal or the third clock signal to trigger pulses in the second clock signal.

21. A circuit for accessing data in a memory array, the circuit comprising:
   a timing circuit configured to provide:
      a first clock signal, the first clock signal having a first pulse;
      a second clock signal, the second clock signal having a second pulse; and
      a third clock signal, the third clock signal having a third pulse and a fourth pulse, the fourth pulse occurring before the third pulse;
   a first sense amplifier coupled to the memory array, wherein the first sense amplifier is configured to sense a bit in the memory array;
   a first interconnect coupled to the first sense amplifier, wherein the first interconnect is configured to receive a first data signal that is dependent from the bit;
   a second sense amplifier coupled to the first interconnect, wherein, in response to the second pulse, the second sense amplifier is configured to generate a second data signal as a function of the first data signal;
   a second interconnect coupled to receive the second data signal; and
   a third sense amplifier coupled to the second interconnect, wherein, in response to the third pulse, the third sense amplifier is configured to output onto an output line an output data signal as a function of the second data signal;
   wherein, during a first mode, the second pulse is triggered by the first pulse and, during a second mode, the second pulse is triggered by the fourth pulse.

22. The circuit of claim 21 further comprising:
   a third interconnect coupled to the first sense amplifier; and
   a fourth sense amplifier coupled between the first interconnect and the third interconnect, wherein, in response to the first pulse, the fourth sense amplifier is configured to generate the first data signal.

23. The circuit of claim 21 wherein during the first mode, the second pulse begins in a first cycle and the third pulse begins in a next cycle.

24. The circuit of claim 21 wherein during the second mode, the second and fourth pulses begin in a first cycle and the third pulse begins in a next cycle.

25. The circuit of claim 21 wherein the first pulse causes a restore operation of the first interconnect.

26. The circuit of claim 25 wherein the second pulse causes a restore operation of the second interconnect.

27. The circuit of claim 21 further comprising an output enable buffer, wherein the output enable buffer is configured to generate an output enable signal having pulses triggered by pulses of a delayed version of an external clock signal.

28. The circuit of claim 27 further comprising a programmable delay circuit, the programmable delay circuit being configured to generate the delayed version of the external clock signal, wherein the programmable delay circuit is configurable to adjust the delay of the delayed version of the external clock signal.

29. The circuit of claim 28 wherein the programmable delay circuit is configurable to adjust the timing of the third clock signal while maintaining an essentially constant relative timing between the output enable signal and the third clock signal.

30. The circuit of claim 21 further comprising a programmable timing circuit, wherein the programmable timing circuit is configurable to adjust the timing of the third clock signal while maintaining an essentially constant relative timing between the second clock signal and the third clock signal during the second mode.

31. The circuit of claim 30 wherein the programmable timing circuit is further configured to cause the first clock signal to trigger pulses in the second clock signal during the first mode and to cause the third clock signal to trigger pulses in the second clock signal during the second mode.

* * * * *